United States Patent [19]

Matzen

[11] 4,035,820

[45] July 12, 1977

[54] ADJUSTMENT OF AVALANCHE VOLTAGE IN DIFMOS MEMORY DEVICES BY CONTROL OF IMPURITY DOPING

[75] Inventor: Walter Theodore Matzen, Richardson, Tex.

[73] Assignee: Texas Instruments Incorporated, Dallas, Tex.

[21] Appl. No.: 644,983

[22] Filed: Dec. 29, 1975

[51] Int. Cl.$^2$ .................. H01L 29/78; H01L 27/02; H01L 29/90; H01L 29/34
[52] U.S. Cl. .................................. 357/23; 357/41; 357/54; 357/13; 357/91; 307/304
[58] Field of Search .................. 357/23, 54, 41, 13, 357/91; 307/304

[56] References Cited

U.S. PATENT DOCUMENTS

| | | | |
|---|---|---|---|
| 3,740,731 | 6/1973 | Ohwada et al. | 357/23 |
| 3,868,187 | 2/1975 | Masuoka | 357/23 |
| 3,882,469 | 5/1975 | Gosney | 357/23 |
| 3,886,582 | 5/1975 | Kobayashi et al. | 357/23 |
| 3,906,296 | 9/1975 | Maserjian | 357/23 |

OTHER PUBLICATIONS

IBM Technical Disclosure Bulletin; by Young; vol. 17, No. 4, Sept. 1974, pp. 1208 and 1209.

*Primary Examiner*—Andrew J. James
*Attorney, Agent, or Firm*—Harold Levine; James T. Comfort; Gary C. Honeycutt

[57] ABSTRACT

A dual injector, floating-gate MOS non-volatile semiconductor memory device (DIFMOS) has been fabricated, wherein the electron injection means comprises a p+n+ junction, the n+ region thereof having a critical dopant concentration, controlled by ion implantation. The junction is avalanched to "write" a charge on the floating gate, and a hole injector junction (n+/p−) is avalanched to "erase" the charge. An MOS sensing transistor, whose gate is an extension of the floating gate, "reads" the presence or absence of charge on the floating gate. In a preferred embodiment, the hole injection means includes an MOS "bootstrap" capacitor for coupling a voltage bias to the floating gate.

5 Claims, 12 Drawing Figures

ADJUSTMENT OF AVALANCHE VOLTAGE IN DIFMOS MEMORY DEVICES BY CONTROL OF IMPURITY DOPING

This invention relates to a dual injector, floating-gate, non-volatile MOS memory device (DIFMOS) and to methods for its fabrication. More particularly, a DIFMOS device is provided with improved means for electron injection, to add or write a stored charge on the gate.

In U.S. Pat. No. 3,881,180 a DIFMOS device was disclosed to consist of four basic parts: (1) a floating gate electrode, (2) an MOS transistor to sense the presence or absence of charge on the gate, (3) an electron injector junction to be avalanched for negatively charging the gate, and (4) a hole injector junction to be avalanched for discharging the floating gate.

The efficiency of injecting electrons depends upon the value of avalanche voltage, $V_{av}$ for the injector junction. It is observed that injection of electrons increases for higher values of avalanche voltage and for higher values of avalanche current. Write pulses (i.e., electron injection) for the device are applied through P-channel MOS decode transistors fabricated on the same chip. Breakdown considerations for the decode transistors limit the maximum value of write voltage, $V_W$, to about −35 volts. The avalanche junction circuit includes significant series resistance, $R_S$, due to the current path through the N- type substrate and the avalanche current, $I_{av}$, is set by $$I_{av} = (V_w - V_{av})/R \text{ series}$$

Maximum injection into the floating gate involves a tradeoff between avalanche voltage and avalanche current. Electron injection will be maximized for an avalanche voltage of about 20 volts.

Prior DIFMOS devices contained electron injection junctions formed by diffusing P+ and N+ regions into an N-substrate. For such overlap (P+N+) junctions, avalanche voltage is typically 12 volts or less. Higher avalanche voltages may be obtained using a gap (P+NN+) junction, for which avalanche voltage increases with the spacing between P+ and N+ regions.

Avalanche voltages in the range of 20 volts have now been obtained with a nominal gap of 0.15 mils; however, avalanche voltages have depended critically on alignment of the N+ oxide removal with respect to the P+ oxide removal, resulting in considerable variability of writing efficiency.

The approach of this invention is to use an overlap junction for the electron injector and to control avalanche voltage by providing a critical doping concentration in the N+ region. Preferably, ion implantation is used to control the doping concentration. Avalanche voltage increases as the N+ concentration is decreased. Mask alignment for the junction is not critical since the P+ and N+ regions overlap.

The DIFMOS devices of the invention have been fabricated using ion implanted phosphorus for the N+ regions. Avalanche voltage has been varied from 24 to 16 volts by adjusting the implanted phosphorus concentration. Good electron injection efficiency was achieved over this range of avalanche voltage.

Repeatable results were obtained for which phosphorus was implanted into silicon; implantation dose and energy were $1.6 \times 10^{13}$ cm$^{-2}$ and 100Kev, respectively. Implantation was followed by a 4-hour anneal at 1000° C in dry oxygen. Observed avalanche voltages for the two runs were 18 and 16 volts. The required N+ concentration might also be obtained by diffusion from a limited source. However, for an avalanche voltage in the range of 15 to 20 volts, the peak dopant concentration of the N+ region must be from $5 \times 10^{16}$ to $2 \times 10^{17}$ cm$^{-3}$, preferably about $1 \times 10^{17}$ cm$^{-3}$. Ion Implantation provides much better control for concentration in this range than diffusion deposition.

The technique described here greatly increases yields of DIFMOS devices, eliminates a critical alignment step, and improves the efficiency of writing. One oxide removal step and an ion implantation step are added to the process to accomplish this.

In a preferred embodiment, the hole injection means includes an N+P− junction for hole generation, and a bootstrap capacitor for coupling a voltage bias to the floating gate electrode during the hole injection step, to improve injection efficiency. The capacitor comprises a metal-oxide-semiconductor structure formed by an extension of the floating gate overlying a p+ region in the substrate, separated therefrom by a portion of the gate oxide layer. The capacitor is also useful to improve the hole injection efficiency of prior DIFMOS devices.

The DIFMOS devices of the invention are designed to be operated in arrays. As such, each bit must have addressing means within the array. Thus, a specific embodiment of the array adaptaion includes the address transistors and the appropriate row and column address connection lines.

The DIFMOS device is intended for applications in which a reprogrammable non-volatile semiconductor memory is required. For example, DIFMOS can be used in semiconductor memory circuits for storing the programming voltages used to control the varactors in electronic TV tuner systems. Another application is program storage in hand-held calculators, or program storage in conjuction with microprocessors.

FIG. 1 is a diagrammatic top view of one bit of the DIFMOS device in a specific embodiment, showing the physical layout of a DIFMOS cell and how the floating gate overlies the sense transistor, the dual electron injector and the hole injector junctions, plus a bootstrap capacitor.

In FIG. 2 the implementation of the cell into an array is illustrated by showing the row and column address lines and the address transistors.

Figure 1:
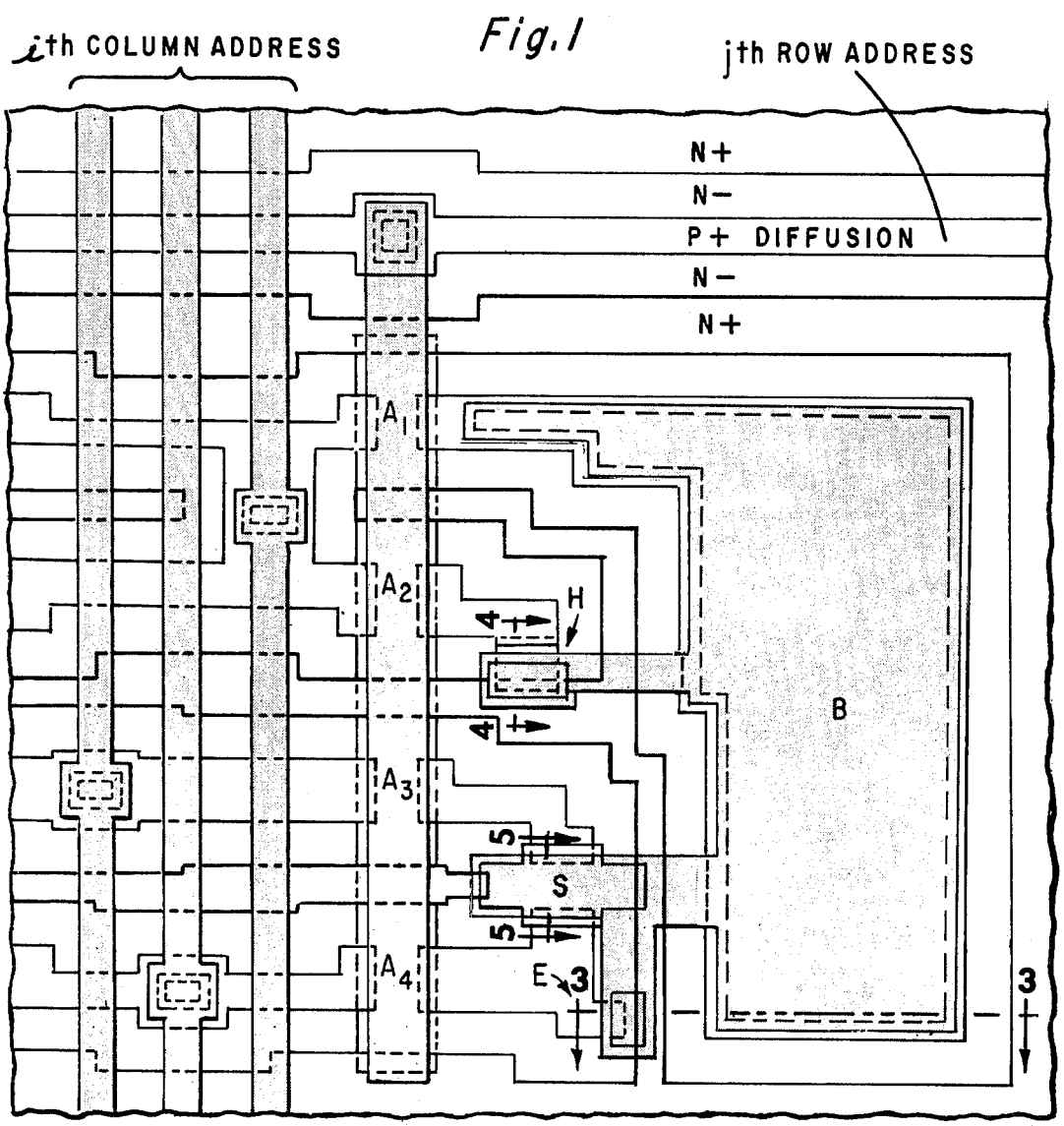

Referring now to FIG. 1, the DIFMOS non-volatile semiconductor memory device is composed of electron injector junction E, hole injector junction H, bootstrap capacitor B to augment hole injection, sense transistor S, and a metal floating gate electrode G which extends over these individual parts. Address transistors A1–A4 and the row and column address lines (FIG 2) are required to connect the DIFMOS devices within an array.

In the specific embodiment, a second DIFMOS device and address transistor set corresponding to an adjacent row address — i.e., row $j$ +1 is located on the left hand side of the column address lines. To simplify the drawings, this device has been omitted.

In general, the device is fabricated on n-type silicon substrates using a CMOS-type process. The address transistors and sense transistors are implemented as p-channel MOS transistor. The CMOS process provides both an n+ and a p− diffusion in addition to the basic PMOS p+ diffusion. The p− diffusion is used in conjunction with n+ to form the hole injector junction. The n+ diffusion is used in both the hole and electron injector junctions, and as a diffused guard ring. Thus, the CMOS p-channel devices with the n+ guard rings can operate with supply voltages over −70 volts with 0.5 mil p+ to n+ spacings. This voltage capability is required in the decode arrays because the bootstrap capacitor requires −35 volts during the erase operation to guarantee sufficient injection of holes to completely turn off the sense transistor. Since the decode and address transistors must supply the −35 volts in a source follower mode of operation, the addressing circuits will require −50 volts for programming. Thus body effects must be minimized, and the substrate resistivity must be no less than 3 ohm-cm. An upper limit of 8 ohm-cm is imposed by punch-through considerations.

Sense transistor S is a PMOS transistor fabricated using the CMOS process. A typical $V_{tx}$ will be between 1.5 to 2.5 volts, with $BV_{dss}$ of −60 volts or more. Because of the lightly doped substrate, the field threshold is only −8 to −10 volts; therefore, guard rings are preferably used to increase the field threshold. In FIG. 1, the n+ diffusion covers all area except the p+ areas, the p− areas, the channel areas, and within 0.5 mils of p+. The substrate material is found between the n+ and p+ regions, and in the channels.

The gate of the sense transistor is an extension of the floating gate of the memory cell. Hence, the source-drain conductivity can be measured from the S to the W/S column lines to determine the state of charge on the floating gate. The address transistors A1–A4 are constructed similar to the sense transistor, except their gates are connected to the row address line diffusion.

Figure 3:
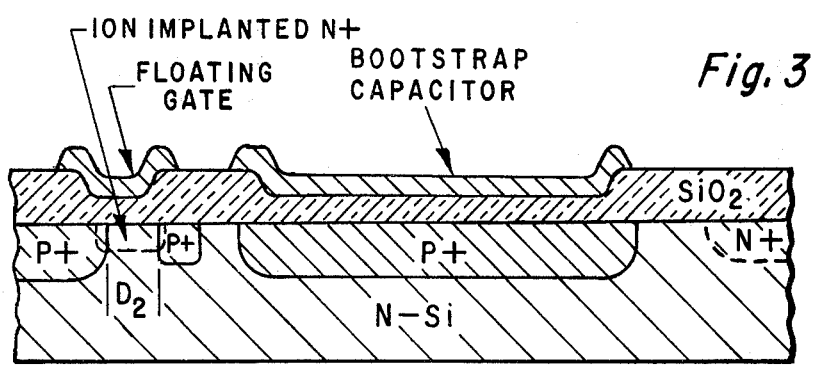
FIGS. 3-5 are cross sections of structural details of the various parts of the DIFMOS device.
Figure 4:
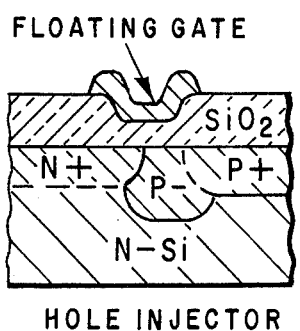
Figure 5:
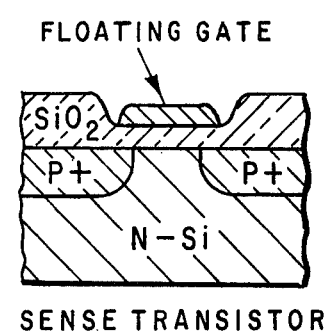

The electron injector E is an oxide-passivated p+/n+ junction underlying the floating gate electrode with a critical n+ doping concentration near $10^{17}$ cm$^{-3}$. In FIG. 3 the 0.5 mil p+ to n+ spacing is designated D2. Ion implantation is used to increase the n-type concentration in the substrate gap between the p+ and n+ diffused regions such that the implantation dose determines the breakdown voltage, and the gap spacing becomes non-critical.

Avalanching the electron injector junction causes energetic electrons to be injected into the gate oxide over the injector region where they are captured by the floating gate. The captured electrons thus charge the floating gate negatively. Injection takes place until the avalanche is stopped, or until the retarding field from the previously captured electrons inhibits further injection.

Electron injection is usually retarded whenever the floating gate voltage is charged to approximately one half the value of the avalanche voltage.

Figure 6:
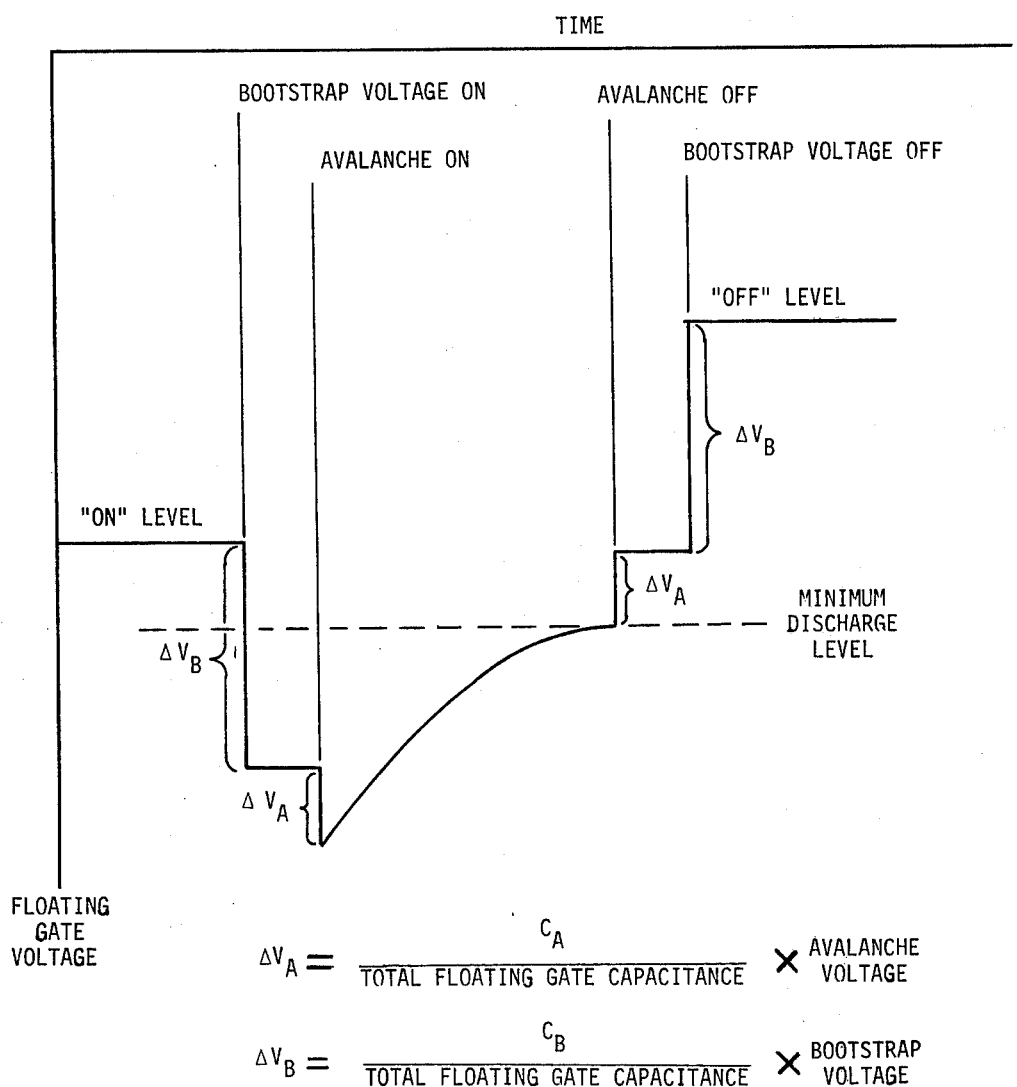
FIG. 6 shows the floating gate voltage levels during hole injection.

Hole injector H consists of an n+/p− junction, with oxide passivation, underlying the floating gate electrode. The avalanche breakdown is set by the p− concentration; typically it is −15 to −25 volts, and preferably about −20 volts. The p− diffusion is the p-type tank diffusion normally used in the regions where n-channel MOS transistors are to be formed in a CMOS structure. The surface dopant concentration is less than $10^{17}$ atoms per cc and preferably from $1 \times 10^{16}$ to $5 \times 10^{16}$. The n+ side of the junction is doped to a surface concentration of at least $10^{18}$ atoms per cc. Avalanching this junction results in the injection of holes into the passivating oxide, provided there is sufficient negative electric field on the floating gate electrode. Although the charged floating gate provides some negative electric field, there is normally not enough field to permit complete removal of the negative charge from the floating gate. It is the purpose of bootstrap capacitor B to augment the negative field during the hole injection avalanche to permit complete removal of the negative charge from the floating gate electrodes. FIG. 6 shows the behavior of the floating gate voltage under influence of the bootstrap voltage. With sufficient bootstrap voltage, the floating gate can be discharged to zero volts. Experimentally, it has been found that −35 volts is usually required on the bootstrap capacitor to erase the stored charge on the floating gate, although some devices require less bootstrap voltage. Structurally, the bootstrap capacitor consists of a large extension of the floating gate electrode overlying a p+ diffusion, and separated from the diffusion by gate oxide. Approximately 90% of the bootstrap voltage applied to the diffusion is actually coupled to the floating gate.

Operation of the hole injector/bootstrap capacitor pair agrees with the minimum discharge level model illustrated in FIG. 6. That is, hole injection can only discharge the floating gate to some minimum negative voltage level. The bootstrap capacitor is used to negatively increase the gate voltage from zero to this minimum value (about −30 volts for example). Thus, any initial negative gate voltage will be made more negative than this minimum level, and will cause hole injection to discharge to the minimum level, as illustrated in FIG. 6. In the specific embodiment shown in FIG. 2, the bootstrap and avalanche voltages are applied simultaneously by the application of voltage to the erase (E) column line, while the row select line is already on. The current supplied to the hole injector is limited to that which can be supplied by the address transistor $A_2$ with drain/source voltage of $V_E - BV_{hole\ injector}$; it typically is of the order of several hundred microamperes. Transistor $A_1$ sees a pure capacitance load so its output voltage quickly goes to $V_E$ or $V_{row} - V_{tx}$, whichever is less. Thus, a single voltage can be used in conjunction with two address transistors to supply the −35 volt bootstrap voltage at zero current and the −20 volt avalanche voltage and current.

Figure 2:
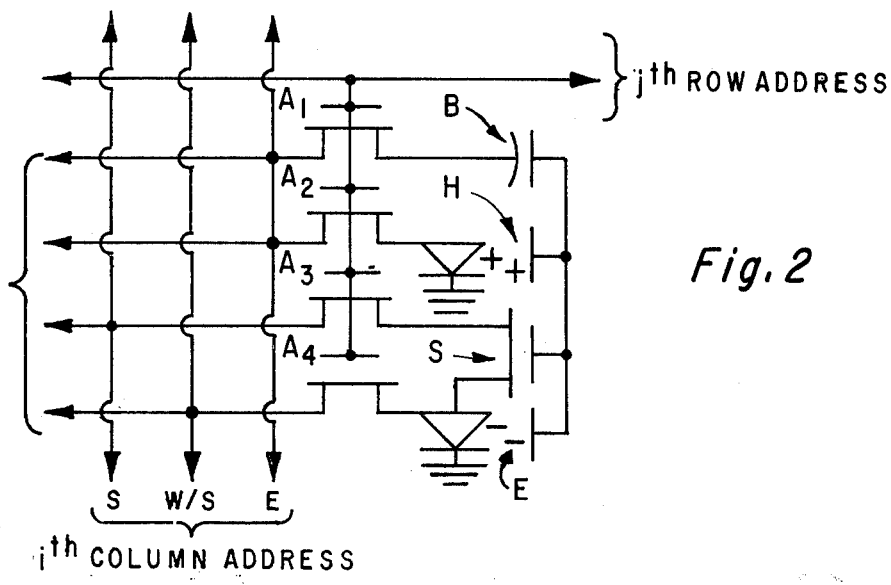

In an array, a cell such as in FIG. 2 is operated by selecting a row and column. An address voltage is applied to a row. The voltage must be greater than −35 plus $V_{tx}$ to insure that the bootstrap will operate, typically about −45 to −50 volts. If programming is not required and it is intended to read only, then a lower voltage such as −17 volts is adequate, but the high voltage must be present for programming.

For purposes of definition, electron injection is defined as writing. This corresponds to charging the floating gate from zero volts to some negative voltage such as −10 volts. Correspondingly, hole injection is defined as erasure, which erases or discharges the floating gate voltage back to zero volts. Alternately, we can also define electron and hole injection as writing 1's and 0's, respectively.

Once a row is selected, then either all bits in that row, or a single bit, or any combination of single bits can be operated giving a "by bit" or "by row" capability. In any case, whether the bit is sensed, written or erased depends upon which column lines are exercised. In the specific embodiment shown, sensing is accomplished by measuring the conductivity between the S and W/S line. Writing is done by avalanching the W/S line with −45 volts. The current supplied to the electron injector is limited by address transistor A4 with source/drain voltage set by $V_W - BV_{electron\ injector}$. Erasing is accomplished by applying the −45 volts to the E column line.

The scope of this invention also covers embodiments in which sensing is accomplished by measuring the low voltage conductivity of the W/S line to ground. This technique requires that the sense transistor source be grounded within the bit, but it permits eliminating the separate S column sense line and address transistor A3 and achieving a smaller cell size. Additionally, the sensing and writing functions can be separated entirely, to provide either three or four column lines, depending upon the desired application, without departing from the scope of the invention. Finally, the size of the bootstrap capacitor can be altered without departing from the scope of this invention. Also, the bootstrap capacitor may be connected through address transistor $A_2$ in parallel with the hole injector junction, instead of having its own separate address transistor. This requires an increase of the floating gate overlap over the hole injector to deliberately increase the $V_A$ contribution.

There are additional process advantages of this device. First, it uses an all-oxide, single-level metal gate manufacturing process with existing design rules and process specifications. Second, the bootstrap capacitor is fabricated using single-level metal planar technology. This is in opposition to other non-volatile memory devices which require polysilicon floating gates with second-level metal overlying the floating gate.

In general, a supply voltage of about −45 to −50 volts is required. Approximately 0 to −10 volts is the range of voltages on the floating gate in the write/erase mode of operation. Storage time is greater than 100 years at room temperature with greater than 90% of the charge remaining at that time. Typical W/E times are 100mS, although longer times give a greater W/E window.

Figure 7:
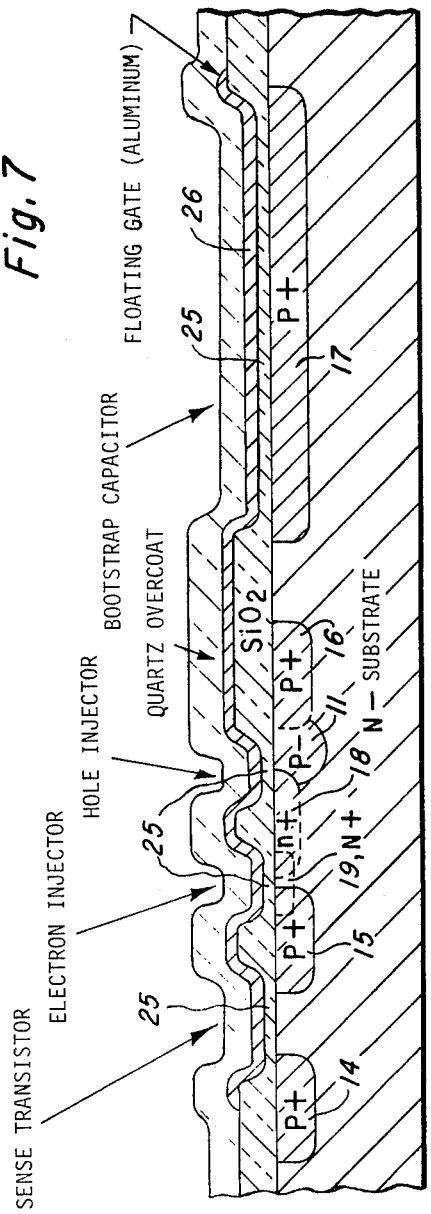
FIG. 7 is a cross-sectional view of the device of the invention.

FIG. 7 shows a cross-sectional diagram of the DIFMOS device of the invention, idealized in that connections to the sense transistor source and drain, the electron injector, the hole injector, and the bootstrap capacitor are not shown. Also, FIG. 7 shows the sense transistor sharing a node with the electron injector. These nodes, within the scope of this invention, may be common or separate.

FIGS. 8 through 11 are cross-sectional views of a semiconductor slice, showing an example of a suitable processing sequence for completing the structure of the invention shown in FIG. 7.

Figure 8:
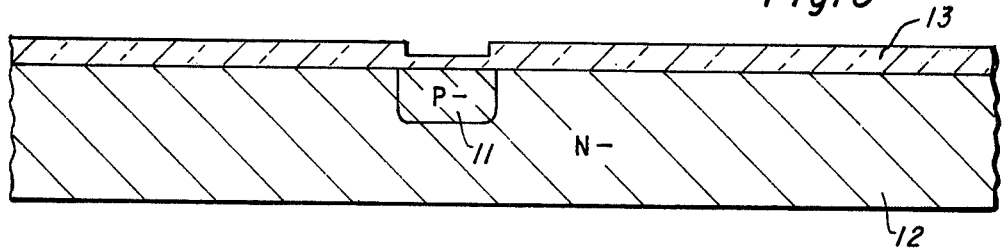

As shown in FIG. 8, p− region 11 of the hole injector is diffused or implanted in n-type substrate 12 of 3-8 ohm-cm, using known methods, to provide a surface p-dopant concentration less than $10^{17}$ atoms per cc, and field oxide layer 13 of about 10,000 Angstroms, for example.

Figure 9:
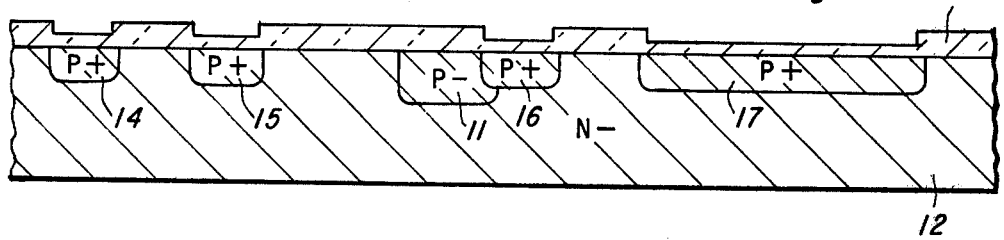

As shown in FIG. 9, p+ regions 14 and 15 of the sense transistor, contact enhancement zone 16 for region, 11, and the bootstrap capacitor plate 17 are then diffused or implanted, using known methods, to provide a surface dopant concentration of at least $10^{18}$ atoms/cc.

Figure 10:
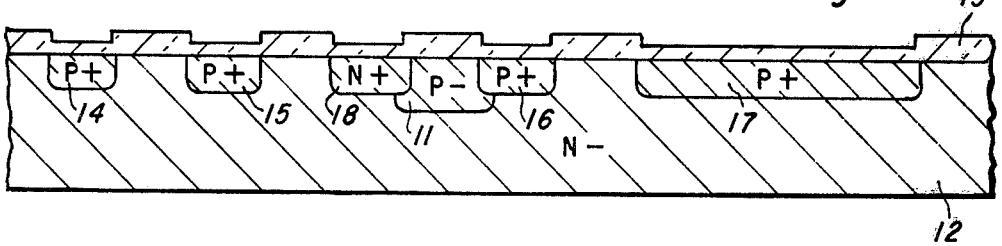

As shown in FIG. 10, n+ region 18 of the hole injector junction is then diffused or implanted, also to provide a dopant concentration of at least $10^{18}$ atoms/cc.

Figure 11:
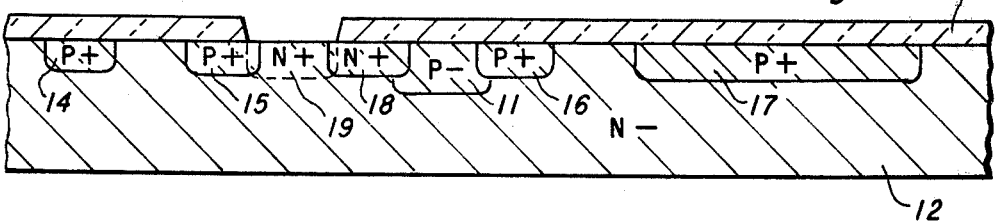

The avalanche voltage of the electron injector junction is then adjusted by phosphorus ion implantation of region 19 which overlaps the adjacent p+ and n+ diffused regions, thereby eliminating the need for critical alignment, as shown in FIG. 11. An implanted peak concentration of $10^{17}$ cm$^{-3}$ is preferred.

Implantation dose is in the range of $5 \times 10^{12}$ cm$^{-2}$ up to $5 \times 10^{13}$ cm$^{-2}$, preferably about $1.0 \times 10^{13}$ cm$^{-2}$. Energies of 70 Kev to 130 Kev, for example about 100 Kev, are preferred.

Figure 12:
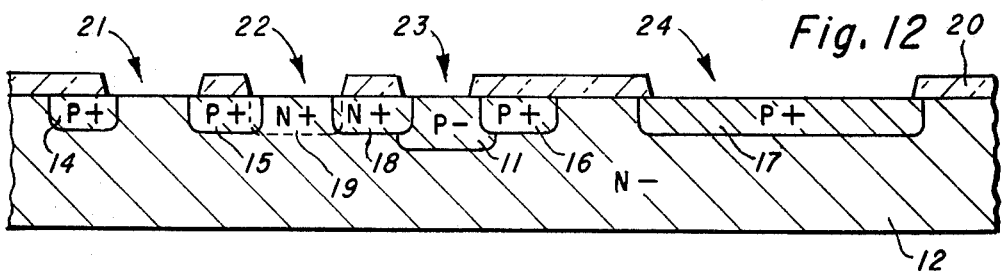

As shown in FIG. 12, a new field oxide layer 20 is patterned to provide windows 21-24 where gate oxide is to be grown. Window 21 for gate oxide for the sense transistor is centered with respect to source and drain regions, as usual for an MOS transistor. Window 22 for placing gate oxide over the electron injector junction must also extend over a substantial portion of the n− side of the junction, where peak electron generation occurs during avalanche. Similarly, window 23 for placing gate oxide over the hole injector junction must also extend over a portion of the p− side of the junction, where peak hole generation occurs during avalanche.

Gate oxide 25 (FIG. 7) is then gorwn in the windows of FIG. 12, to a thickness of about 800-1000 Angstroms, followed by deposition of the floating gate conductor 26 (aluminum, for example) and patterning of the gate, to yield the completed structure.

What is claimed is:

1. A semiconductor memory device having a monocrystalline semiconductor substrate of one conductivity type, an electrically isolated floating gate conductor overlying said substrate electron injection means in said substrate at least partially underlying said gate, hole injection means in said substrate spaced from said electron injector means and at least partially underlying said gate, and means for sensing the presence or absence of charge on said gate, wherein said electron injection means comprises an n+/p+ junction having a peak dopant concentration no greater than about $2 \times 10^{17}$ cm$^{-3}$ on the n+ side, said n+ region having an implanted dopant profile, whereby peak dopant concentration is located beneath the semiconductor surface.

2. A device as in claim 1 wherein said n+/p+ junction comprises an n+ region having a peak dopant concentration of $10^{17}$ atoms/cc.

3. A device as in claim 1 wherein said hole injection means comprises an n+p− junction, and a capacitor of which a portion of said gate is one plate, and a p− type region in said substrate is the other plate.

4. A semiconductor memory device comprising:
   a. a monocrystalline semiconductor substrate of one conductivity type;
   b. an adherent layer of insulating material covering one surface thereof;
   c. an adherent electrically isolated floating gate conductor layer on said insulating material;
   d. an n+p+ junction in said substrate for injecting electrons into and through said insulating layer for capture and storage on said gate, the n+ region thereof having a peak dopant concentration no greater than about $2 \times 10^{17}$ cm$^{-3}$; said n+ region having an implanted dopant profile, whereby peak dopant concentration is located beneath the semiconductor surface;

e. means in said substate for injecting holes into and through said insulating layer for neutralizing stored charge in said gate; and f. means in said substrate for sensing the presence or absence of charge in said gate.

5. A device as in claim 4 wherein said hole injection means comprises an n+/p− junction in said substrate at least partially underlying said gate, and wherein the n+ region of said hole injection means overlaps the n+ region of said electron injection means.

* * * * *